(12) United States Patent
Yeh

(10) Patent No.: US 11,049,894 B2
(45) Date of Patent: Jun. 29, 2021

(54) SOLDER MASK DAM DESIGN

(71) Applicant: OmniVision Technologies, Inc., Santa Clara, CA (US)

(72) Inventor: Chien-Chan Yeh, Changhua County (TW)

(73) Assignee: OmniVision Technologies, Inc., Santa Clara, CA (US)

( * ) Notice: Subject to any disclaimer, the term of this patent is extended or adjusted under 35 U.S.C. 154(b) by 45 days.

(21) Appl. No.: 16/183,339

(22) Filed: Nov. 7, 2018

(65) Prior Publication Data

US 2020/0144321 A1 May 7, 2020

(51) Int. Cl.
*H01L 31/0203* (2014.01)
*H01L 27/146* (2006.01)

(52) U.S. Cl.
CPC .. *H01L 27/14632* (2013.01); *H01L 27/14618* (2013.01); *H01L 27/14623* (2013.01); *H01L 27/14636* (2013.01); *H01L 27/14687* (2013.01)

(58) Field of Classification Search
CPC ......... H01L 27/14643; H01L 27/14632; H01L 27/14687; H01L 27/14623; H01L 27/14618
See application file for complete search history.

(56) References Cited

U.S. PATENT DOCUMENTS

| | | | |
|---|---|---|---|
| 8,507,312 B2 | 8/2013 | Chu et al. | |
| 8,507,316 B2 | 8/2013 | Chu et al. | |
| 9,450,004 B2 | 9/2016 | Tu et al. | |
| 2007/0190747 A1 | 8/2007 | Humpston et al. | |
| 2012/0161308 A1* | 6/2012 | Chu | H01L 21/78 257/692 |

FOREIGN PATENT DOCUMENTS

TW 201236117 9/2012

OTHER PUBLICATIONS

ROC (Taiwan) Application No. 108140198—Office Action with English translation, dated Aug. 25, 2020, 20 pages.

* cited by examiner

*Primary Examiner* — Samuel A Gebremariam
(74) *Attorney, Agent, or Firm* — Christensen O'Connor Johnson Kindness PLLC

(57) ABSTRACT

An image sensor package includes a transparent material, and a substrate adhered to the transparent material. An image sensor is disposed on or within the substrate so that the image sensor is disposed between the substrate and the transparent material to receive light from an optical side of the image sensor package through the transparent material. A solder mask dam is disposed between the substrate and the transparent material to form a gap between the image sensor and the transparent material, and the solder mask dam is structured to indicate an orientation of the image sensor, when the image sensor is viewed from the optical side.

9 Claims, 10 Drawing Sheets

SOLDER MASK DAM DESIGN

TECHNICAL FIELD

This disclosure relates generally to semiconductor device packaging, and in particular but not exclusively, relates to image sensor packaging.

BACKGROUND INFORMATION

Image sensors have become ubiquitous. They are widely used in digital still cameras, cellular phones, security cameras, as well as medical, automobile, and other applications. The technology used to manufacture image sensors has continued to advance at a great pace. For example, the demands of higher resolution and lower power consumption have encouraged the further miniaturization and integration of these devices.

The typical image sensor operates as follows. Image light from an external scene is incident on the image sensor. The image sensor includes a plurality of photosensitive elements such that each photosensitive element absorbs a portion of incident image light. Photosensitive elements included in the image sensor, such as photodiodes, each generate image charge upon absorption of the image light. The amount of image charge generated is proportional to the intensity of the image light. The generated image charge may be used to produce an image representing the external scene.

Image sensor packaging is important to prevent degradation to the image sensor device, and because packaging provides structure to place the image sensor in larger electronic devices without complex soldering procedures (e.g., cell phones). However, packaging must be carefully designed so the final sensor product is compatible with the other electronic devices.

BRIEF DESCRIPTION OF THE DRAWINGS

Non-limiting and non-exhaustive examples of the invention are described with reference to the following figures, wherein like reference numerals refer to like parts throughout the various views unless otherwise specified.

Figure 1A:
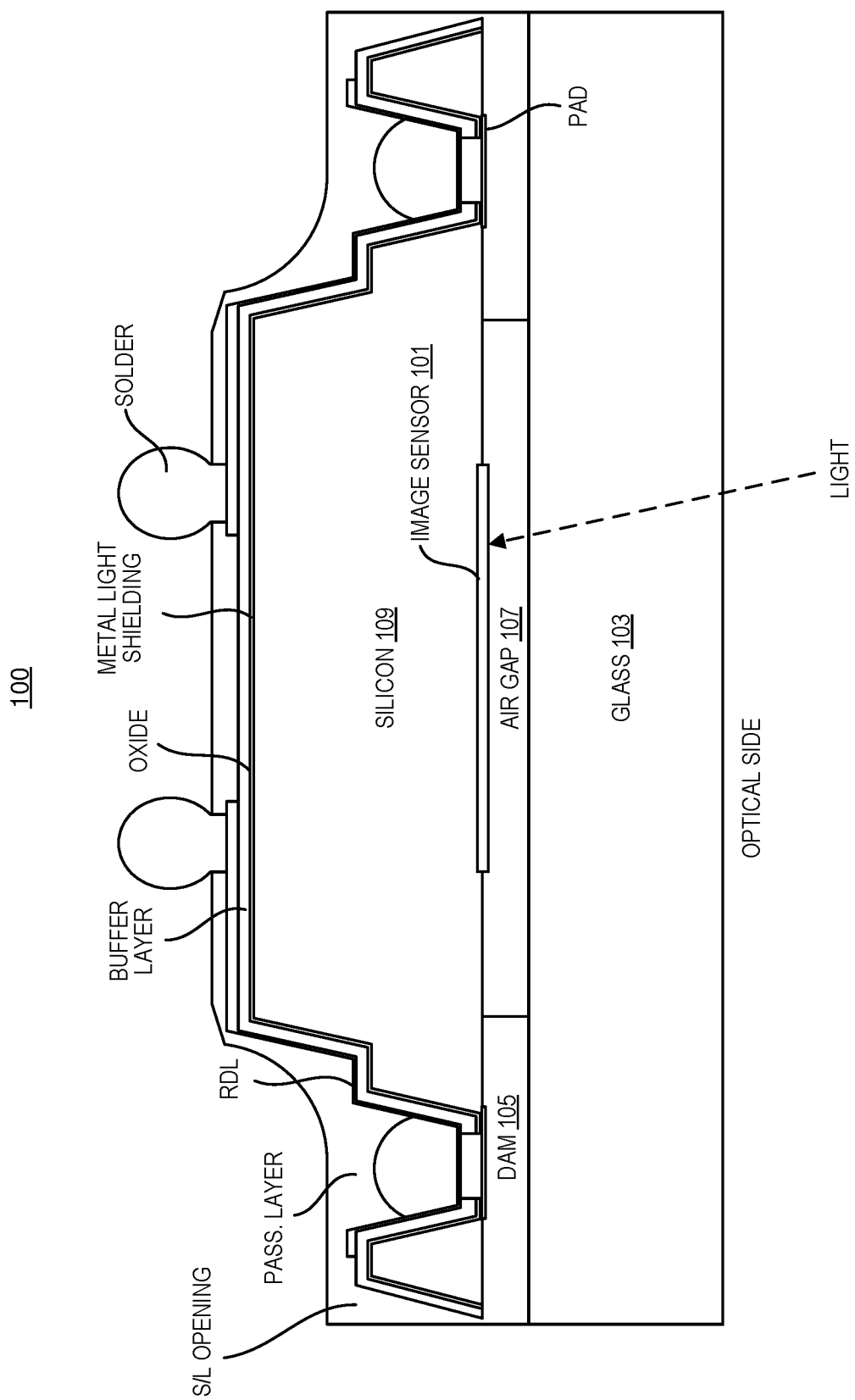
FIG. 1A illustrates a cross section of an image sensor package, in accordance with the teachings of the present disclosure.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Examples of an apparatus, system, and method for a solder mask dam are described herein. In the following description, numerous specific details are set forth to provide a thorough understanding of the examples. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

In the past, the offset orientation of the image sensor in the image sensor package is apparent from visible inspection due to the offset of the image sensor in the package. Auto-orientation check systems can rely on shifted sensor area in order to determine sensor orientation. However, the offset has become less apparent because the package processing requirements have changed. This kind of chip design (with slight or no offset) will likely be ubiquitous moving forward. Accordingly, the auto-orientation check system will encounter no specific pattern to recognize image sensor orientation. Improper identification of orientation may cause manufacturing problems.

Accordingly, examples herein show unique patterns of solder mask dams on glass (SMDG) to resolve the problems with the auto-orientation check system: the solder mask dams are constructed to elicit orientation information from visible inspection. Generally speaking, several broad categories of dam designs (see e.g., FIGS. 2A-2T) are proposed: modifying the outer dam pattern to have unique pattern at a corner or one of four sides, modifying the inner dam pattern, adding a connection between inner and outer dams, creating discontinuities in the inner and/or outer dams (to form an open, not-closed, annulus), adding a unique dam pattern at an empty area between inner and outer dams, or any combination thereof.

The following disclosure will further describe the embodiments discussed above, and other embodiments, as they relate to the figures.

FIG. 1A illustrates a cross section of image sensor package 100, in accordance with the teachings of the present disclosure. Image sensor package 100 includes image sensor 101 (e.g., CMOS image sensor or the like), transparent material 103 (e.g., glass, quartz, sapphire, or the like), solder mask dam 105 (e.g., polymer material—including negative or positive photoresist, or the like), cavity 107 (e.g., filled with air, inert gas, vacuum or the like), substrate 109 (e.g., silicon, dopant, oxide layers, support circuitry for image sensor 101, etc.).

On the backside of substrate 109 is redistribution layer ("RDL"; e.g., a layer on an electronic chip to make pads of an integrated circuit available in many locations, which may include layers of Ti/Cu, Ni/Au), a buffer layer, an oxide layer (e.g., silicon oxide or the like), a metal shielding layer, passivation layer (e.g., a solder mask film), an S/L opening (e.g., a location where silicon is etched out of scribe line regions), and solder balls. Solder balls may be used to attach image sensor package 100 to other circuitry, such as a printed circuit board including a processor, or the like. In the depicted example, contact pads may be formed on edges of the image sensor package.

As depicted, transparent material 103 is adhered to substrate 109, and image sensor 101 is disposed on or within substrate 109 (e.g., here, substrate 109 includes a silicon wafer, and the image sensor 101 is formed in the silicon) so that image sensor 101 is disposed between substrate 109 and transparent material 103 to receive light from the optical side (e.g., side of image sensor where image light originates from) of image sensor package 100 through transparent material 103. Solder mask dam 105 is disposed between substrate 109 and transparent material 103 to form gap 107 between image sensor 101 and transparent material 103. Put another way, solder mask dam 105 acts as a spacer between substrate 109 and transparent material 103. As will be shown in FIGS. 2A-2T, solder mask dam 105 is structured to indicate an orientation of image sensor 101, when image sensor 101 is viewed from the optical side.

Figure 1B:
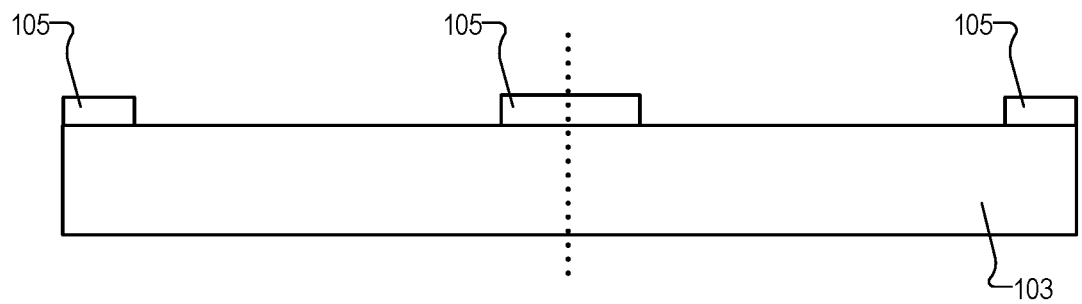
FIGS. 1B-1C illustrate assembly of the image sensor package of FIG. 1A, in accordance with the teachings of the present disclosure.
Figure 1C:
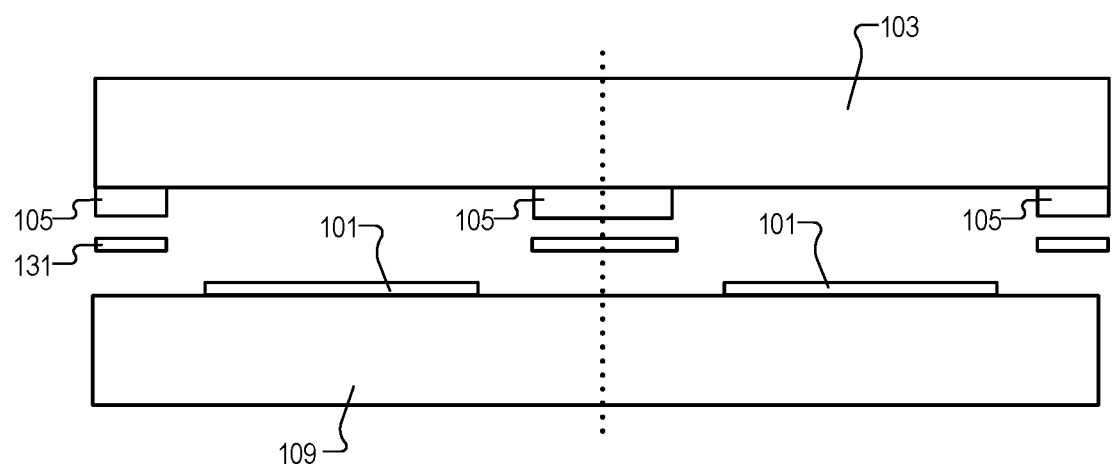

FIGS. 1B-1C illustrate a method of fabricating the image sensor package 100 of FIG. 1A, in accordance with the teachings of the present disclosure. One of skill in the art will appreciate that elements depicted in FIG. 1A have been omitted from FIG. 1B to avoid obscuring certain aspects of the disclosure. Moreover, the order of operations may occur in any order and even in parallel.

Figure 2A:
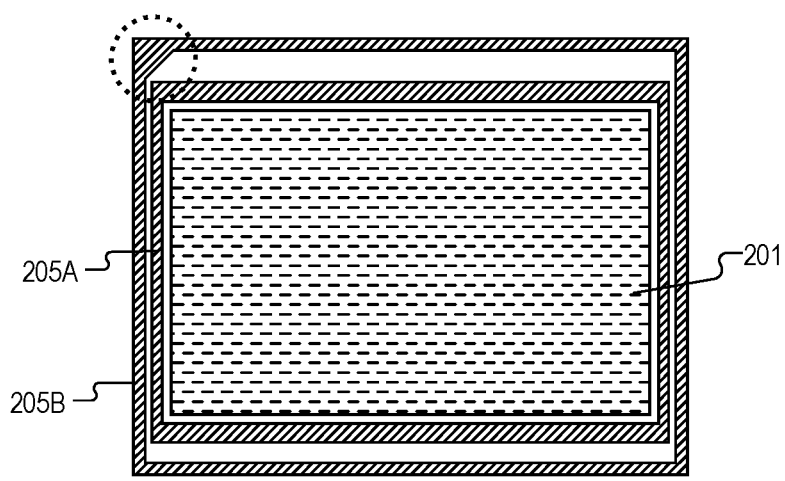
FIGS. 2A-2T illustrate solder mask dam designs, in accordance with the teachings of the present disclosure.
Figure 2B:
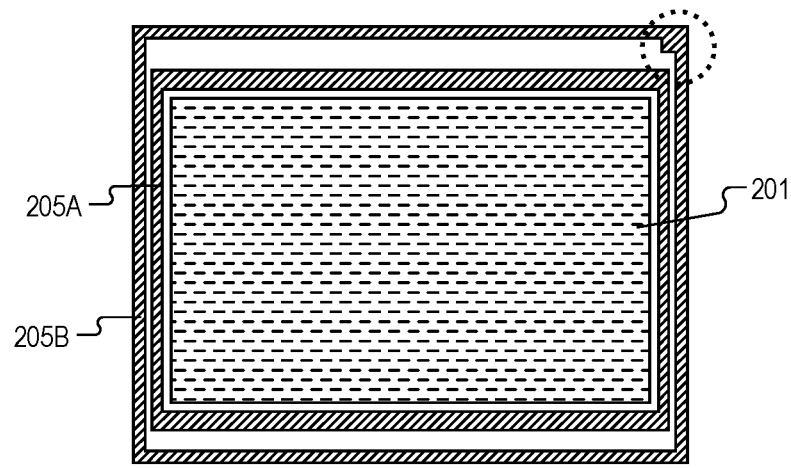
Figure 2C:
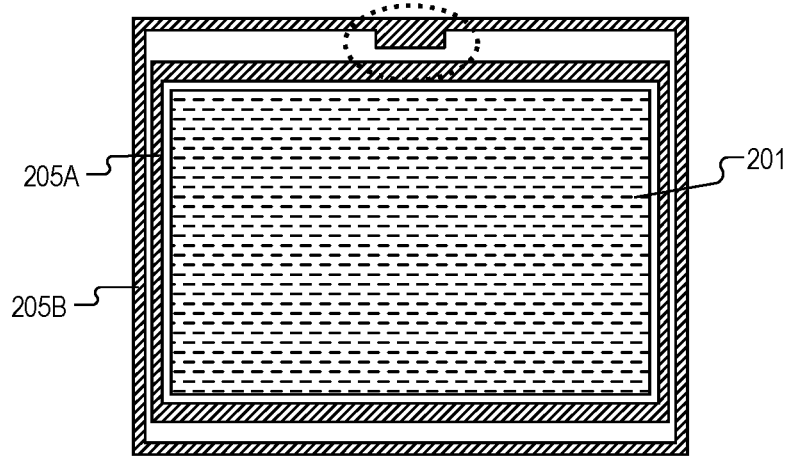
Figure 2D:
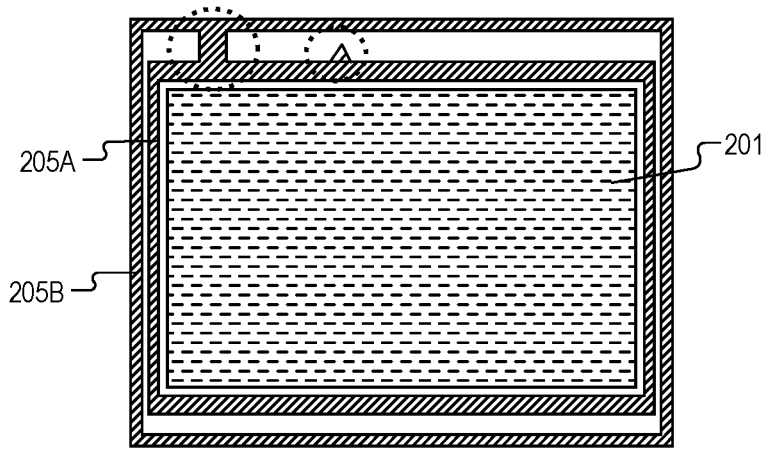
Figure 2E:
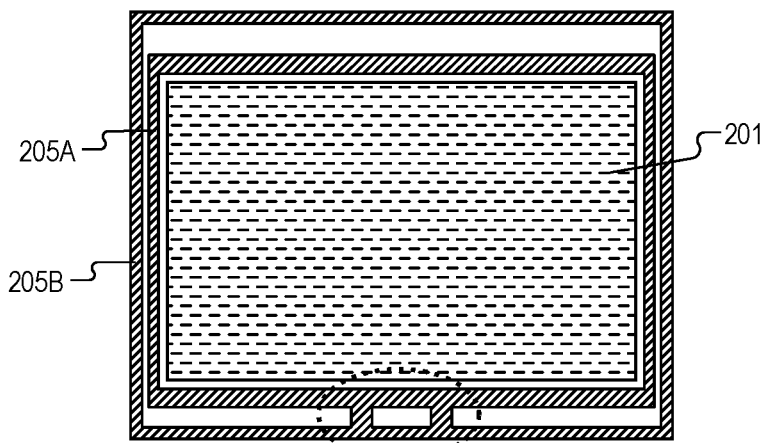
Figure 2F:
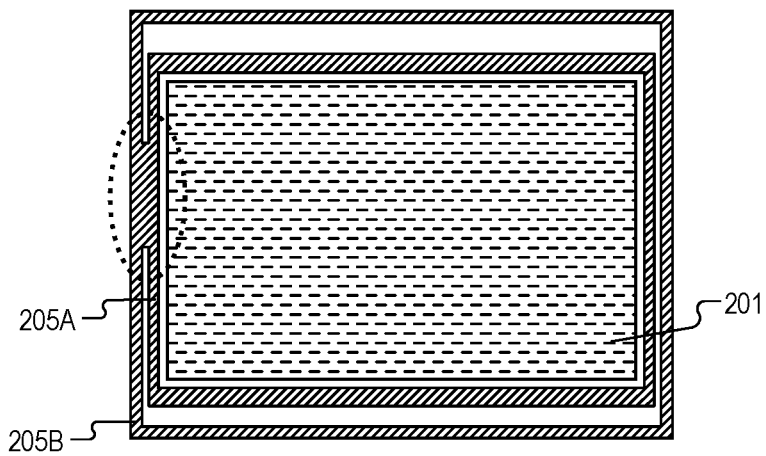
Figure 2G:
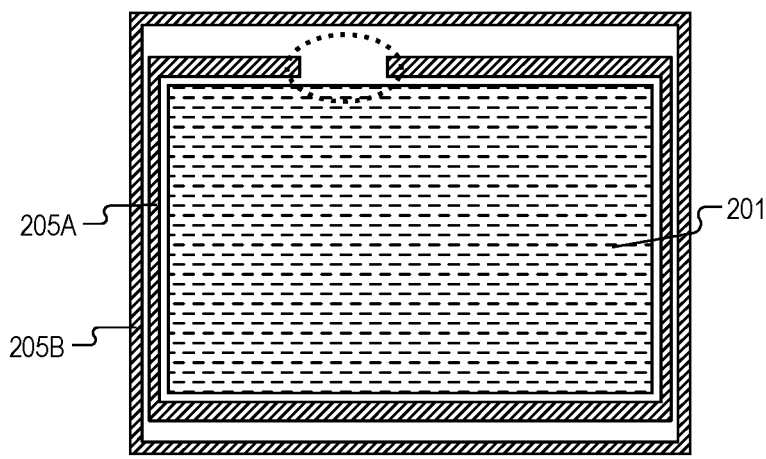
Figure 2H:
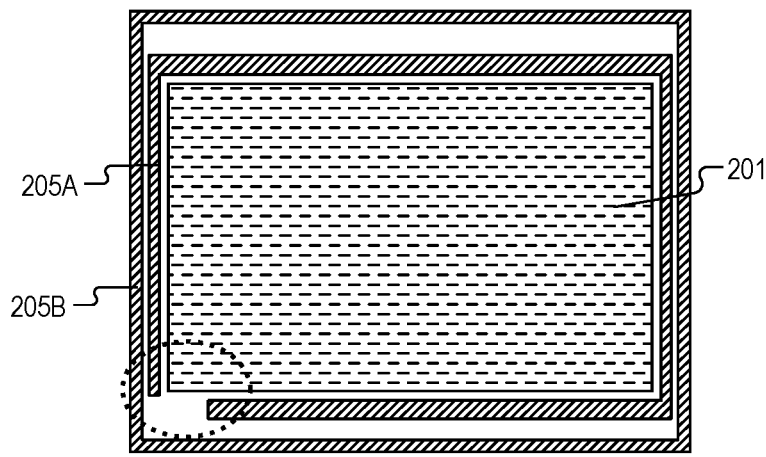
Figure 2I:
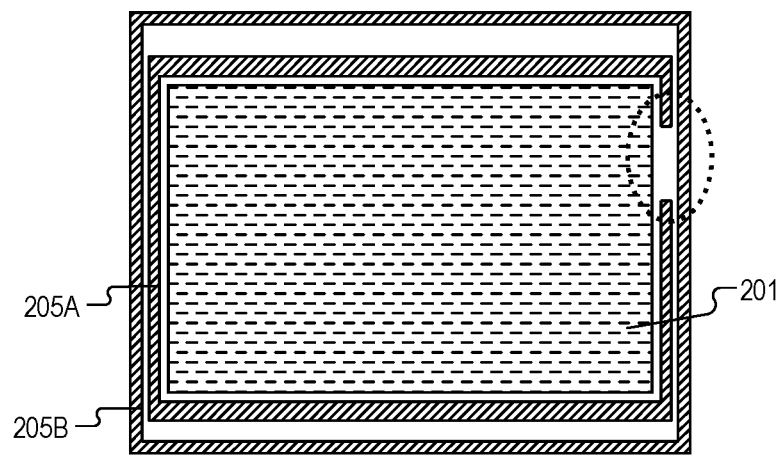
Figure 2J:
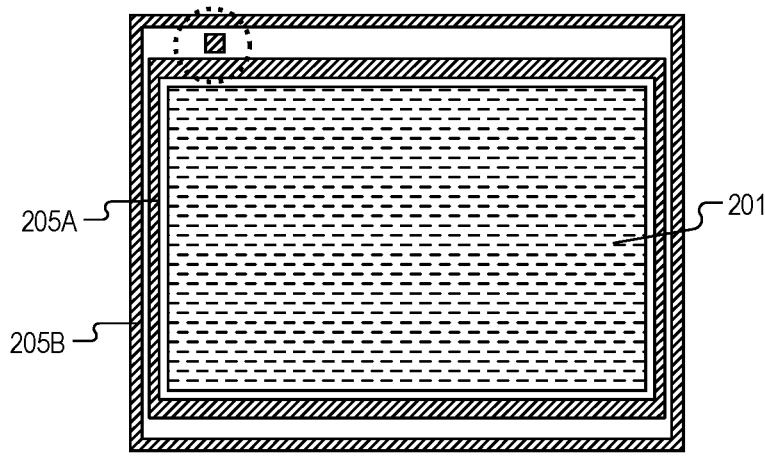
Figure 2K:
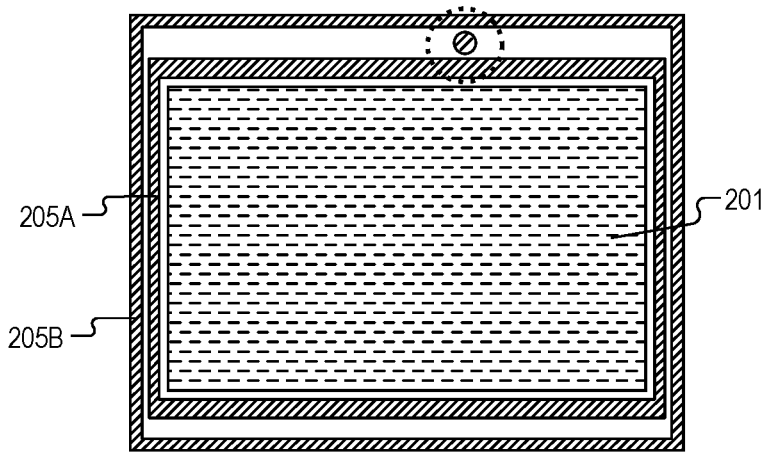
Figure 2L:
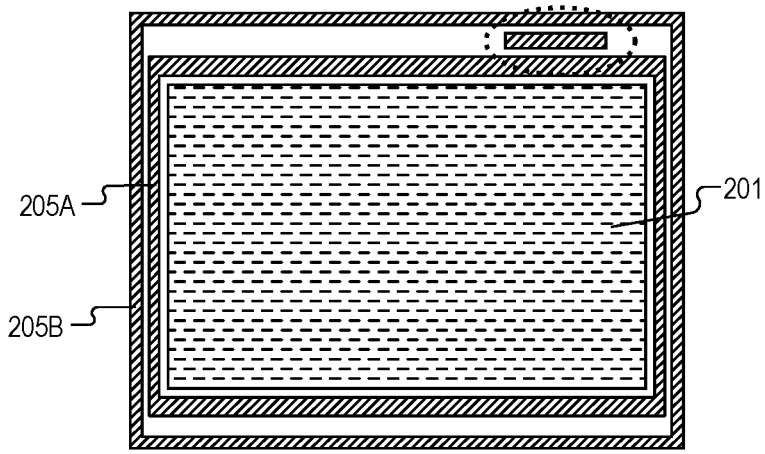
Figure 2M:
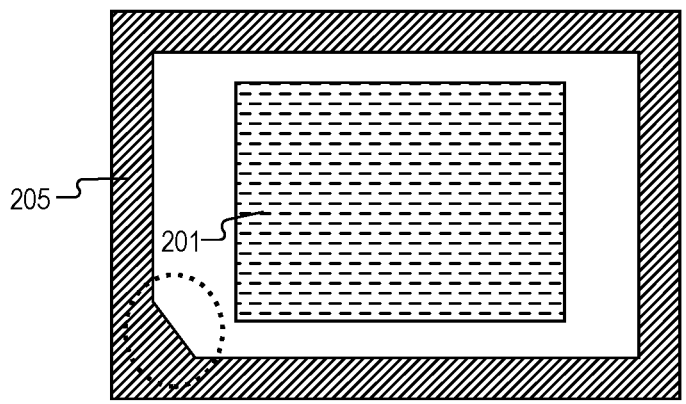
Figure 2N:
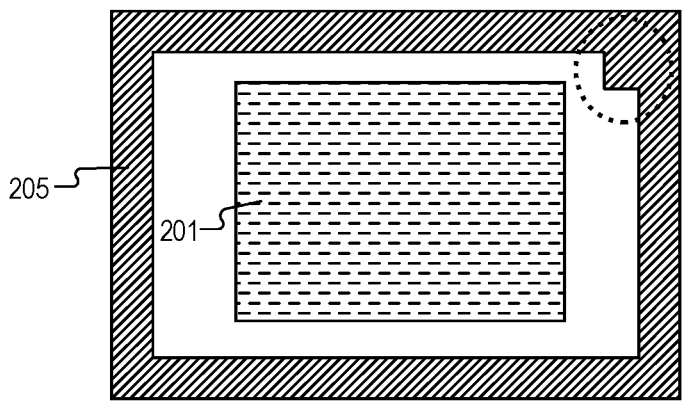
Figure 2O:
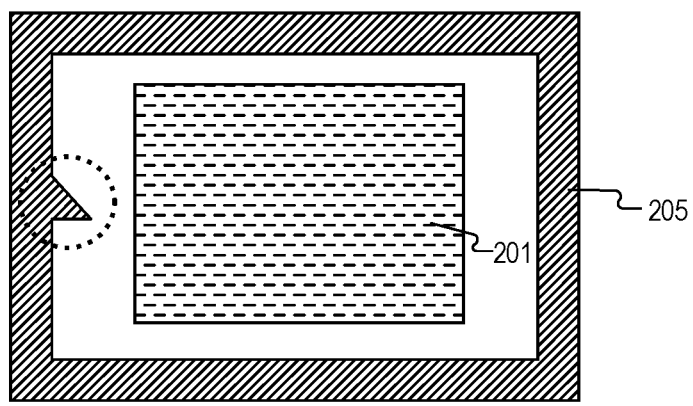
Figure 2P:
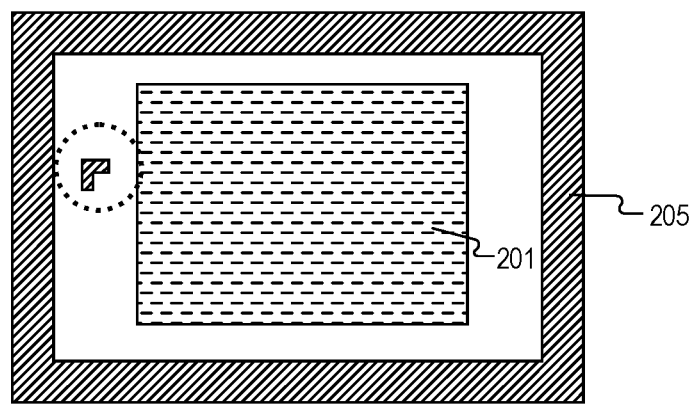
Figure 2Q:
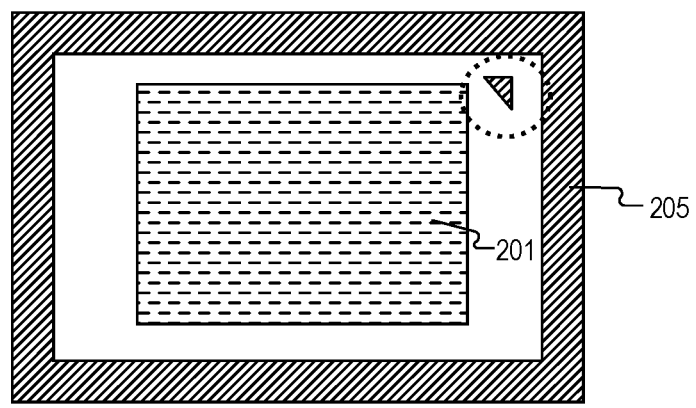
Figure 2R:
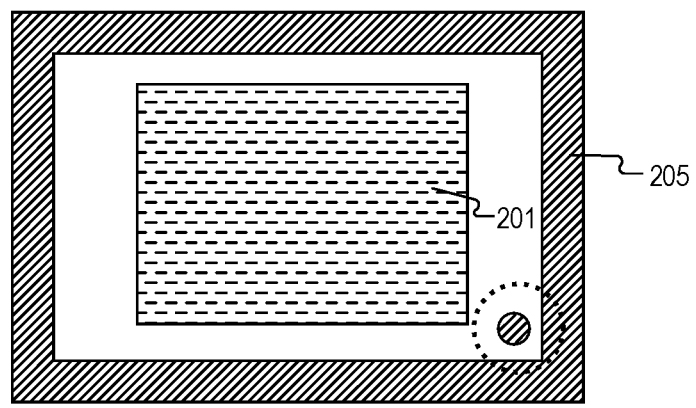
Figure 2S:
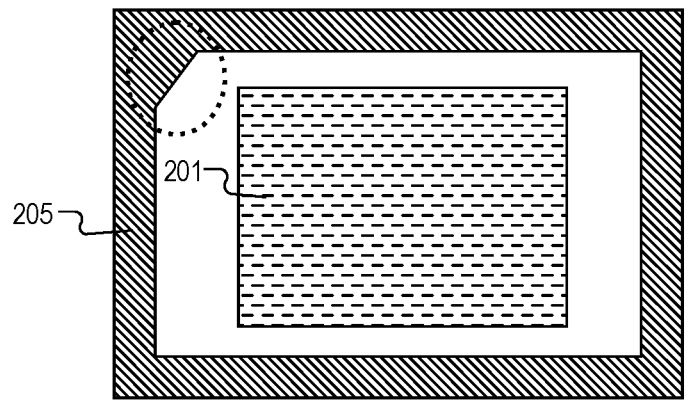
Figure 2T:
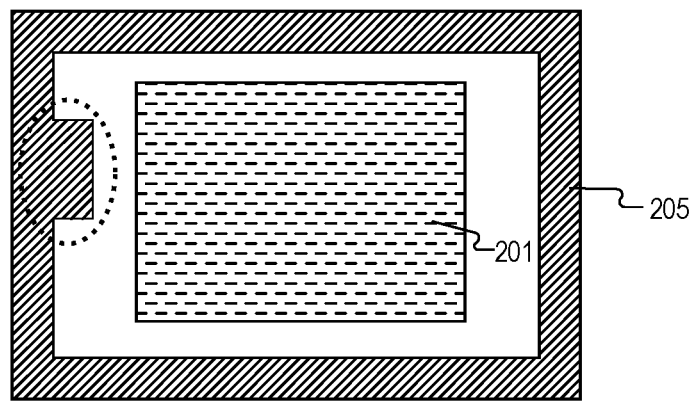

In FIG. 1B the solder mask dam 105 is formed (e.g., via photolithography or printing) on transparent material 103, and the solder mask dam 105 is asymmetrical (see e.g., FIGS. 2A-2T).

FIG. 1C depicts forming image sensor 101 in (or on) substrate 109, and attaching the transparent material 103 to substrate 109 so that light travels from the optical side of the image sensor package through transparent material 103 to image sensor 101. As shown, solder mask dam 105 forms a gap between image sensor 101 and the transparent material 103, and solder mask dam 105 is attached to the substrate to indicate an orientation of image sensor 101 (when image sensor 101 is viewed from the optical side). In the depicted example, attaching the transparent material 103 to substrate 109 includes applying adhesive 131 (e.g., glue or the like) between solder mask dam 105 and substrate 109 to attach solder mask dam 105 to substrate 109.

In the depicted example, dashed lines depict scribe lines for separating (e.g., via dicing) image sensor package from a plurality of image sensor packages (after attaching transparent material 103 to substrate 109).

FIGS. 2A-2T illustrate solder mask dam designs (as viewed through the optical side of the image sensor package), in accordance with the teachings of the present disclosure. One of ordinary skill in the art will appreciate that these are merely examples, and that other designs may be used. It appreciated that many of the same structures are repeated in the various embodiments/examples, and that the structures depicted in FIGS. 2A-2T are not mutually exclusive (e.g., multiple asymmetrical markings may be combined in the same embodiment to indicate the orientation of the image sensor package with a higher degree of accuracy or indicate the position of certain pieces of device architecture in the image sensor package).

One of ordinary skill in the art will appreciate that the solder mask dam examples shown are "substantially rectangular", which is inclusive of rectangular shapes having protrusions, partial cutouts, discontinuities, connectors between multiple dams, lines that are not straight, and the like. Further, substantially rectangular shapes may have jagged/triangular interior and/or exterior edges, and have rounded interior/exterior corners.

FIG. 2A depicts a solder mask dam 205A/205B that includes inner dam 205A and outer dam 205B. Inner dam 205A encircles image sensor 201, and outer dam 205B encircles inner dam 205A. As shown, inner dam 205A is closer to image sensor 201 than outer dam 205B. As shown, solder mask dam 205A/205B is substantially rectangular, and solder mask dam 205A/205B is structured to indicate the orientation of image sensor 201 by being shaped asymmetrically. Here, the asymmetry is the filled triangular upper left-hand corner of outer dam 205B. Since the package is visually asymmetrical the auto-orientation check system can reliably determine sensor orientation, in accordance with the teachings of the present disclosure.

FIG. 2B illustrates a solder mask dam 205A/205B that includes inner dam 205A and outer dam 205B. The solder mask dam 205A/205B in FIG. 2B is similar to the dam in FIG. 2A; however, the asymmetry in FIG. 2B is the filled rectangle (a protrusion that extends from outer dam 205B towards inner dam 205A) in the upper right-hand corner of outer dam 205B.

FIG. 2C illustrates a solder mask dam 205A/205B that includes inner dam 205A and outer dam 205B. The solder mask dam 205A/205B in FIG. 2C is similar to the dam in FIG. 2B; however, the asymmetry in FIG. 2C is the filled rectangular shape (e.g., a protrusion that extends from outer dam 205B towards inner dam 205A) in the middle of, and on a longer side, of the rectangular outer dam 205B.

FIG. 2D illustrates a solder mask dam 205A/205B that includes inner dam 205A and outer dam 205B. The solder mask dam 205A/205B in FIG. 2D is similar to the dam in FIG. 2C; however, the asymmetry in FIG. 2D is the filled rectangular shape bridging inner dam 205A and outer dam 205B in the upper left-hand corner. FIG. 2D also has a triangular protrusion that extends from inner dam 205A towards outer dam 205B.

FIG. 2E illustrates a solder mask dam 205A/205B that includes inner dam 205A and outer dam 205B. The solder mask dam 205A/205B in FIG. 2E is similar to the dam in FIG. 2D; however, the asymmetry in FIG. 2E is the plurality of filled rectangular shapes bridging inner dam 205A and outer dam 205B in the bottom center of the device along a longer side of the rectangle.

FIG. 2F illustrates a solder mask dam 205A/205B that includes inner dam 205A and outer dam 205B. The solder mask dam 205A/205B in FIG. 2F is similar to the dam in FIG. 2E; however, the asymmetry in FIG. 2F is the filled rectangle (longer than wide) bridging inner dam 205A and outer dam 205B on the left-hand side of the device along a shorter side of the rectangular structure.

FIG. 2G illustrates a solder mask dam 205A/205B that includes inner dam 205A and outer dam 205B. The solder mask dam 205A/205B in FIG. 2G is similar to the dam in FIG. 2F; however, the asymmetry in FIG. 2G is the discontinuity (e.g., no dam material present) in inner dam 205A near the upper left-hand corner.

FIG. 2H illustrates a solder mask dam 205A/205B that includes inner dam 205A and outer dam 205B. The solder mask dam 205A/205B in FIG. 2H is similar to the dam in FIG. 2G; however, the asymmetry in FIG. 2H is the discontinuity (e.g., no dam material present) in inner dam 205A at the bottom left-hand corner.

FIG. 2I illustrates a solder mask dam 205A/205B that includes inner dam 205A and outer dam 205B. The solder mask dam 205A/205B in FIG. 2I is similar to the dam in FIG. 2H; however, the asymmetry in FIG. 2I is the discontinuity (e.g., no dam material present) in inner dam 205A on the right-hand (smaller) side of the rectangular structure. Thus, inner dam 205A surrounds image sensor 101 at least in part.

FIG. 2J illustrates a solder mask dam 205A/205B that includes inner dam 205A and outer dam 205B. The solder mask dam 205A/205B in FIG. 2J is similar to the dam in FIG. 2I; however, the asymmetry in FIG. 2J is the rectangular inclusion in the upper left hand corner between inner dam 205A and outer dam 205B.

FIG. 2K illustrates a solder mask dam 205A/205B that includes inner dam 205A and outer dam 205B. The solder mask dam 205A/205B in FIG. 2K is similar to the dam in FIG. 2J; however, the asymmetry in FIG. 2K is the circular inclusion in the upper right-hand side between inner dam 205A and outer dam 205B.

FIG. 2L illustrates a solder mask dam 205A/205B that includes an inner dam 205A and an outer dam 205B. The solder mask dam 205A/205B in FIG. 2L is similar to the dam in FIG. 2K; however, the asymmetry in FIG. 2L is the rectangular inclusion in the upper right side between inner dam 205A and the outer dam 205B.

FIG. 2M illustrates solder mask dam 205 that includes a single dam. The solder mask dam 205A/205B in FIG. 2L is similar to the dam in FIG. 2A. In the depicted example, the asymmetry includes a triangular bottom left-hand corner of solder mask dam 205.

FIG. 2N illustrates solder mask dam 205 that includes a single dam. The solder mask dam 205A/205B in FIG. 2N is similar to the dam in FIG. 2B because the asymmetry includes filled rectangle (a protrusion that extends from dam 205 towards image sensor 201) in the upper right-hand corner of the rectangular structure.

FIG. 2O illustrates a solder mask dam 205 that includes a single dam. The asymmetry depicted here includes a triangular protrusion (a protrusion that extends from dam 205 towards image sensor 201) on the left (smaller) edge of the rectangle.

FIG. 2P illustrates a solder mask dam 205 that includes a single dam. The asymmetry depicted here includes an "L" shaped inclusion between image sensor 201 and dam 205 on the left side of the package.

FIG. 2Q illustrates a solder mask dam 205 that includes a single dam. The asymmetry depicted here includes a triangular inclusion between image sensor 201 and dam 205 in the upper right-hand corner of the package.

FIG. 2R illustrates a solder mask dam 205 that includes a single dam. The asymmetry depicted here includes a circular inclusion between image sensor 201 and dam 205 in the lower right-hand corner of the package.

FIG. 2S illustrates a solder mask dam 205 that includes a single dam. The asymmetry depicted here includes a triangular protrusion in the upper left-hand interior corner of dam 205.

FIG. 2T illustrates a solder mask dam 205 that includes a single dam. The asymmetry depicted here includes a rectangular protrusion from solder mask dam 205 on the left-hand side of the image sensor 201 near the upper left-hand corner.

Figure 3:
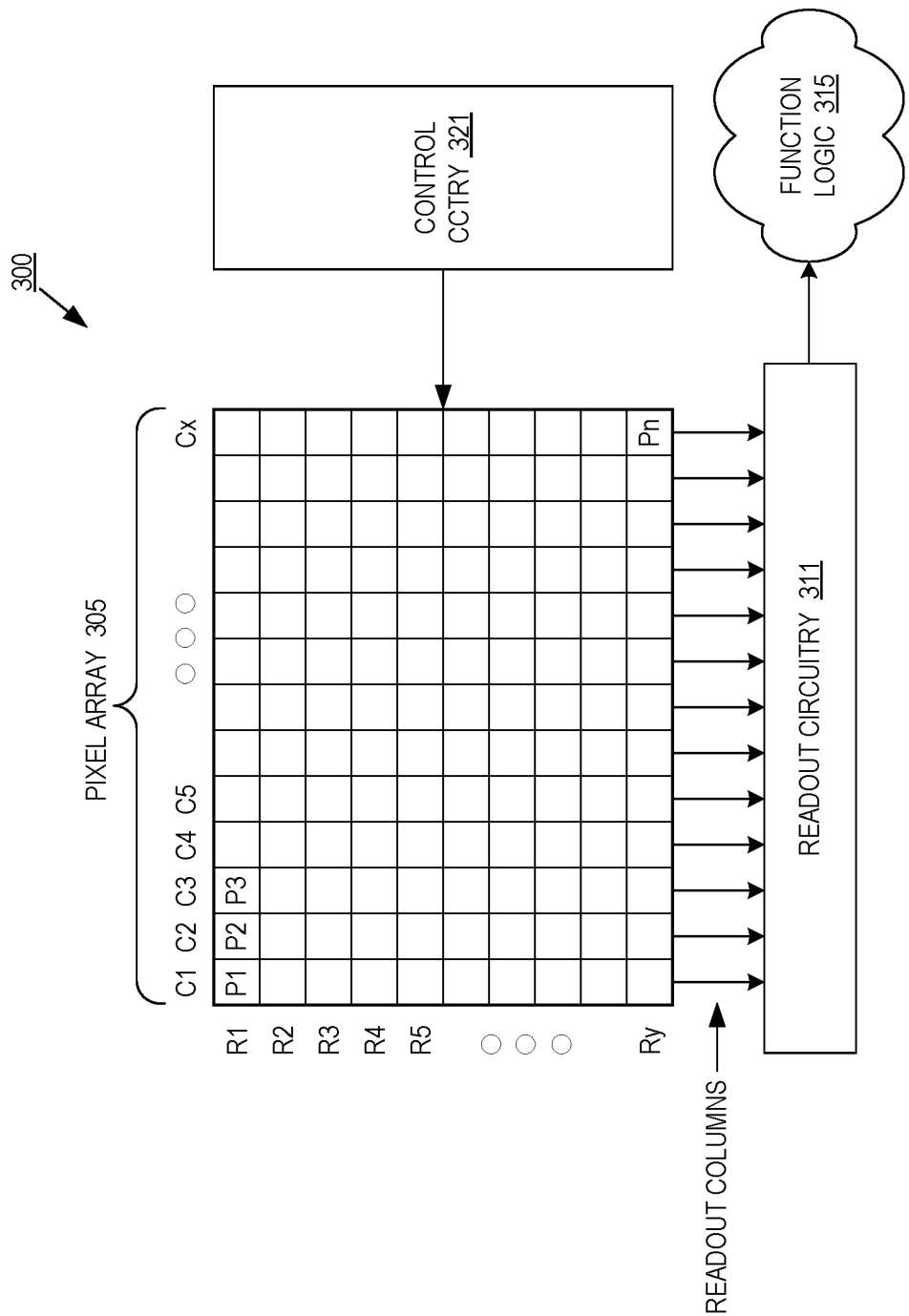
FIG. 3 illustrates an image sensor system, in accordance with the teachings of the present disclosure.

FIG. 3 illustrates an imaging system 300, in accordance with the teachings of the present disclosure. Image sensor system 300 may be included in the image sensor package in FIGS. 1A-1C. Imaging system 300 includes pixel array 305, control circuitry 321, readout circuitry 311, and function logic 315. In one example, pixel array 305 is a two-dimensional (2D) array of photodiodes, or image sensor pixels (e.g., pixels P1, P2 . . . , Pn). As illustrated, photodiodes are arranged into rows (e.g., rows R1 to Ry) and columns (e.g., column C1 to Cx) to acquire image data of a person, place, object, etc., which can then be used to render a 2D image of the person, place, object, etc. However, photodiodes do not have to be arranged into rows and columns and may take other configurations.

In one example, after each image sensor photodiode/pixel in pixel array 305 has acquired its image data or image charge, the image data is readout by readout circuitry 311 and then transferred to function logic 315. In various examples, readout circuitry 311 may include amplification circuitry, analog-to-digital (ADC) conversion circuitry, or otherwise. Function logic 315 may simply store the image data or even manipulate the image data by applying post image effects (e.g., autofocus, crop, rotate, remove red eye, adjust brightness, adjust contrast, or otherwise). In one example, readout circuitry 311 may readout a row of image data at a time along readout column lines (illustrated) or may readout the image data using a variety of other techniques (not illustrated), such as a serial readout or a full parallel readout of all pixels simultaneously.

In one example, control circuitry 321 is coupled to pixel array 305 to control operation of the plurality of photodiodes in pixel array 305. For example, control circuitry 321 may generate a shutter signal for controlling image acquisition. In the depicted example, the shutter signal is a global shutter signal for simultaneously enabling all pixels within pixel array 305 to simultaneously capture their respective image data during a single acquisition window. In another example, image acquisition is synchronized with lighting effects such as a flash.

Imaging system 300 may be coupled to other pieces of hardware such as a processor (general purpose or otherwise), memory elements, output (USB port, wireless transmitter, HDMI port, etc.), lighting/flash, electrical input (keyboard, touch display, track pad, mouse, microphone, etc.), and/or display. Other pieces of hardware may deliver instructions to imaging system 300, extract image data from imaging system 300, or manipulate image data supplied by imaging system 300.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. An image sensor package, comprising:
   a transparent material;
   a substrate adhered to the transparent material;
   an image sensor disposed on or within the substrate so that the image sensor is disposed between the substrate and the transparent material to receive light from an optical side of the image sensor package through the transparent material; and
   a solder mask dam disposed between the substrate and the transparent material to form a gap between the image sensor and the transparent material, wherein the solder mask dam is shaped asymmetrically when viewed from the optical side to indicate an orientation of the image sensor.

2. The image sensor package of claim 1, wherein the solder mask dam encircles the image sensor.

3. The image sensor package of claim 2, wherein the solder mask dam is substantially rectangular.

4. The image sensor package of claim 1, wherein the solder mask dam includes an inner dam and an outer dam, wherein the inner dam is separated from the outer dam such that a second gap is disposed between the inner dam and the outer dam, wherein the inner dam encircles the image sensor at least in part, and the outer dam encircles the inner dam at least in part, and wherein the inner dam is closer to the image sensor than the outer dam.

5. The image sensor package of claim 4, wherein the solder mask dam is shaped asymmetrically by including at least one unique pattern corresponding to a protrusion extending from the outer dam towards the inner dam, a protrusion extending from the inner dam towards the outer dam, a protrusion bridging the inner dam and the outer dam, a discontinuity in the inner dam, or an inclusion between the inner dam and the outer dam.

6. The image sensor package of claim 1, wherein the solder mask dam is shaped asymmetrically by including at least one unique pattern corresponding to a protrusion extending from the solder mask dam towards the image sensor, a cutout of the solder mask dam, or an inclusion between the image sensor and the dam.

7. The image sensor package of claim 1, further comprising adhesive disposed between the solder mask dam and the substrate to attach the solder mask dam to the substrate.

8. The image sensor package of claim 1, wherein the substrate includes a silicon wafer, and wherein the image sensor is formed in the silicon wafer.

9. The image sensor package of claim 1, wherein the transparent material includes a glass layer, and the gap includes air.

\* \* \* \* \*